United States Patent [19]

Yamazaki

[11] Patent Number: 4,615,298

[45] Date of Patent: Oct. 7, 1986

[54] METHOD OF MAKING NON-CRYSTALLINE SEMICONDUCTOR LAYER

[76] Inventor: Shunpei Yamazaki, 21-21 Kitakarasuyama 7-chome, Setagaya-ku, Tokyo, Japan

[21] Appl. No.: 619,834

[22] Filed: Jun. 12, 1984

Related U.S. Application Data

[60] Continuation of Ser. No. 309,709, Oct. 8, 1981, which is a division of Ser. No. 177,889, Aug. 14, 1980, abandoned.

[30] Foreign Application Priority Data

Aug. 16, 1979 [JP] Japan .................. 54-104452

[51] Int. Cl.$^4$ .................. C23C 11/00
[52] U.S. Cl. .................. 118/723; 118/719; 118/725; 118/50.1; 118/900
[58] Field of Search .................. 118/715, 718, 719, 723, 118/733, 900, 724, 725, 50.1; 427/255.2, 255.1, 38, 85, 397.7, 74, 76, 39

[56] References Cited

U.S. PATENT DOCUMENTS

| | | | |
|---|---|---|---|
| 4,123,316 | 10/1978 | Tsuchimoto | 156/643 |
| 4,196,438 | 4/1980 | Carlson | 357/15 |
| 4,251,287 | 2/1981 | Dalal | 136/258 |
| 4,317,844 | 3/1982 | Carlson | 427/39 |
| 4,328,258 | 5/1982 | Coleman | 427/39 |

FOREIGN PATENT DOCUMENTS

117269 4/1958 U.S.S.R. .................. 118/729

OTHER PUBLICATIONS

Barber, "Two-Chamber Air-to-Vacuum Lock System", IBM Tech. Disclosure Bulletin, vol. 11. No. 7, Dec. 1968, pp. 757-758.

*Primary Examiner*—Norman Morgenstern
*Assistant Examiner*—K. Jaconetty
*Attorney, Agent, or Firm*—Gerald J. Ferguson, Jr.; James E. Bryan; Michael P. Hoffman

[57] ABSTRACT

Substrates are disposed in a reaction chamber having a gas inlet and a gas outlet and a mixture gas containing at least a semiconductor material gas and a carrier gas is introduced into the reaction chamber in such a state in which a gas in the reaction chamber is exhausted therefrom. An electromagnetic field is applied to the mixture gas to ionize it into a mixture gas plasma in the reaction chamber, by which a semiconductor material is deposited on each substrate. In this case, the semiconductor material thus deposited on each substrate becomes a non-crystalline semiconductor by holding the atmospheric pressure in the reaction chamber below 1 atm and maintaining the substrate at a temperature lower than a temperature at which the semiconductor material on the substrate becomes crystallized.

The reaction chamber is provided with a gas ionizing region on the side of the gas inlet and a semiconductor depositing region on the side of the gas outlet. In the gas ionizing region, the mixture gas is ionized by a high-frequency electromagnetic field having a high alternating frequency. The mixture gas plasma thus formed in the gas ionizing region is passed into the semiconductor depositing region, in which the substrates are each placed and deposited with the non-crystalline semiconductor layer.

4 Claims, 3 Drawing Figures

METHOD OF MAKING NON-CRYSTALLINE SEMICONDUCTOR LAYER

This is a continuation application of Ser. No. 309,709, filed Oct. 8, 1981, which in turn is a division of Ser. No. 177,889 filed Aug. 14, 1980, now abandoned.

BACKGROUND OF THE INVENTION

1. Field of the Invention

This invention relates to a method of making a non-crystalline semiconductor layer on a substrate, and more particularly to a non-crystalline semiconductor layer manufacturing method which is of particular utility when employed in the fabrication of a semiconductor photoelectric conversion device which may be used as a solar battery.

2. Description of the Prior Art

A semiconductor photoelectric conversion device using a non-crystalline semiconductor layer composed of amorphous or semi-amorphous semiconductor layers has now been taken notice of because the non-crystalline semiconductor layer may be formed thin, that is, the semiconductor material needed is small in amount and because the photoelectric conversion efficiency can be enhanced, as compared with a semiconductor photoelectric conversion device employing a single crystal or polycrystalline semiconductor.

The following method has heretofore been proposed for forming a non-crystalline semiconductor layer or a substrate.

The substrate is disposed in a reaction tube chamber having a gas inlet and a gas outlet, and a mixture gas including at least a semiconductor material gas and a carrier gas is introduced into the reaction chamber in a state that a gas in the reaction chamber is exhausted through the gas outlet. An electromagnetic field is applied to the mixture gas to ionize it into a plasma, thereby to deposit a semiconductor material on the substrate. In this case, the atmospheric pressure in the reaction chamber is held below 1 atm and the substrate is maintained at a temperature lower than that at which the semiconductor material deposited on the substrate is formed as a crystalline semiconductor layer, thereby to obtain a desired non-crystalline semiconductor layer on the substrate.

With the conventional method, the substrate is usually disposed in that region of the reaction chamber in which the mixture gas plasma is produced. In this case, however, it is very difficult to form the mixture gas plasma homogeneously over the entire surface of the substrate in the reaction chamber because of the plasma forming mechanism.

Accordingly, the prior art method is defective in that the non-crystalline semiconductor layer formed on the substrate has many voids and is unhomogeneous in the direction of the plane of the semiconductor layer. Further, even if non-crystalline semiconductor layers are formed concurrently and individually on a number of substrates placed in the reaction chamber, the non-crystalline semiconductor layers are inevitably subject to dispersion in property; consequently, the conventional method is incapable of mass production of non-crystalline semiconductor layers of good quality.

Moreover, in the conventional method, the electromagnetic field for ionizing the mixture gas into a plasma is usually a DC electromagnetic field or a low-frequency electromagnetic field, so that the ratio in which the mixture gas is ionized into the plasma is very low.

In addition, the conventional method employs a hydrogen gas and/or an argon gas as the carrier gas, and consequently the resulting mixture gas plasma is a hydrogen gas plasma and/or argon gas plasma. Since such a carrier gas composed of the hydrogen gas and/or argon gas is ionized by a relatively low ionizing energy into a plasma, the carrier gas plasma has only a small plasma energy. Therefore, the carrier gas plasma has substantially no or a little function of promoting the ionization of a semiconductor compound gas included in the mixture gas.

Accordingly, the conventional method is defective in that the resulting semiconductor layer contains many voids and is not homogeneous in the direction of its surface.

Besides, since the carrier gas plasma composed of the hydrogen gas plasma and/or argon gas plasma is very low in thermal conductivity, the carrier gas plasma has substantially no or a little function of making the temperature distribution of the mixture gas plasma uniform throughout the reaction chamber.

Accordingly, the conventional method is incapable of a homogeneous non-crystalline, semiconductor layer.

SUMMARY OF THE INVENTION

Accordingly, it is an object of the present invention to provide a novel non-crystalline semiconductor layer manufacturing method which is free from the abovesaid defects of the prior art.

According to the method of the present invention, use is made of a reaction chamber in which a gas inlet, a gas ionizing region, a semiconductor depositing region and a gas outlet are provided in this order. A substrate is disposed in the semiconductor depositing region of the reaction chamber and a mixture gas containing at least a semiconductor material gas and a carrier gas, which is composed of or contains a helium and/or neon gas, is introduced into the gas ionizing region through the gas inlet, with a gas in the reaction chamber exhausted through the gas outlet. A high-frequency electromagnetic field is applied to the mixture gas to ionize it into a mixture gas plasma. By exhausting the gas in the reaction chamber through the gas outlet, the mixture gas plasma is flowed into the semiconductor depositing region to deposit a semiconductor material on the substrate. In this case, the atmospheric pressure in the reaction chamber is maintained below 1 atm, and the substrate is held at a temperature lower than a temperature at which a crystalline semiconductor layer is formed. In this way, a desired non-crystalline semiconductor layer is formed on the substrate.

In accordance with the method of the present invention, the reaction chamber has the gas ionizing region and the semiconductor depositing region, and the mixture gas plasma is formed in the gas ionizing region and then flowed in the semiconductor depositing region. Therefore, in the semiconductor depositing region the mixture gas plasma is substantially homogeneous throughout it. And the substrate is placed in the semiconductor depositing region in which such a substantially homogeneous mixture gas plasma is provided.

Accordingly, the method of the present invention has the advantage that the non-crystalline semiconductor layer deposited on the substrate can be obtained as a non-crystalline smiconductor layer which has substantially no or a negligibly small number of voids and is homogeneous in the direction of its plane. Moreover, even if non-crystalline semiconductor layers are formed concurrently and individually on a number of substrates placed in the semiconductor depositing region, no dispersion is introduced in their property; accordingly, this provides the advantage that non-crystalline semiconductor layers of good quality can be mass-produced.

Moreover, since the method of the present invention employs a high-frequency electromagnetic field for ionizing the mixture gas into the mixture gas plasma, the ratio of ionizing the mixture gas into the mixture gas plasma is far higher than in the case of the prior art method.

Furthermore, in the method of the present invention, since the carrier gas used is composed of or contains a helium gas and/or neon gas, the carrier gas plasma contained in the mixture gas plasma is composed of or contains a helium gas plasma and/or neon gas plasma. Such a carrier gas is ionized by a far higher ionizing energy than that for a carrier gas composed of a hydrogen gas and/or argon gas, so that the carrier gas employed in the method of the present invention has a larger plasma energy than the carrier gas used in the prior art. Consequently, the carrier gas plasma greatly promotes the ionization of the semiconductor material gas contained in the mixture gas.

Accordingly, the method of the present invention is advantageous in that the resulting non-crystalline semiconductor layer is free from voids and homogeneous in the direction of its surface.

In addition, the carrier gas plasma used in the method of the present invention is composed of or contains the helium gas plasma and/or neon gas plasma, and hence is far higher in thermal conductivity than the carrier gas used in the past. Therefore, the carrier gas plasma employed in the present invention ensures to provide a uniform temperature distribution of the mixture gas plasma over the entire surface of the substrate.

Accordingly, the method of the present invention exhibits the advantage that a homogeneous, non-crystalline semiconductor layer can easily be obtained.

Other objects, features and advantages will become more apparent from the following description taken in conjunction with the accompanying drawings.

DESCRIPTION OF THE PREFERRED EMBODIMENTS

Figure 1:
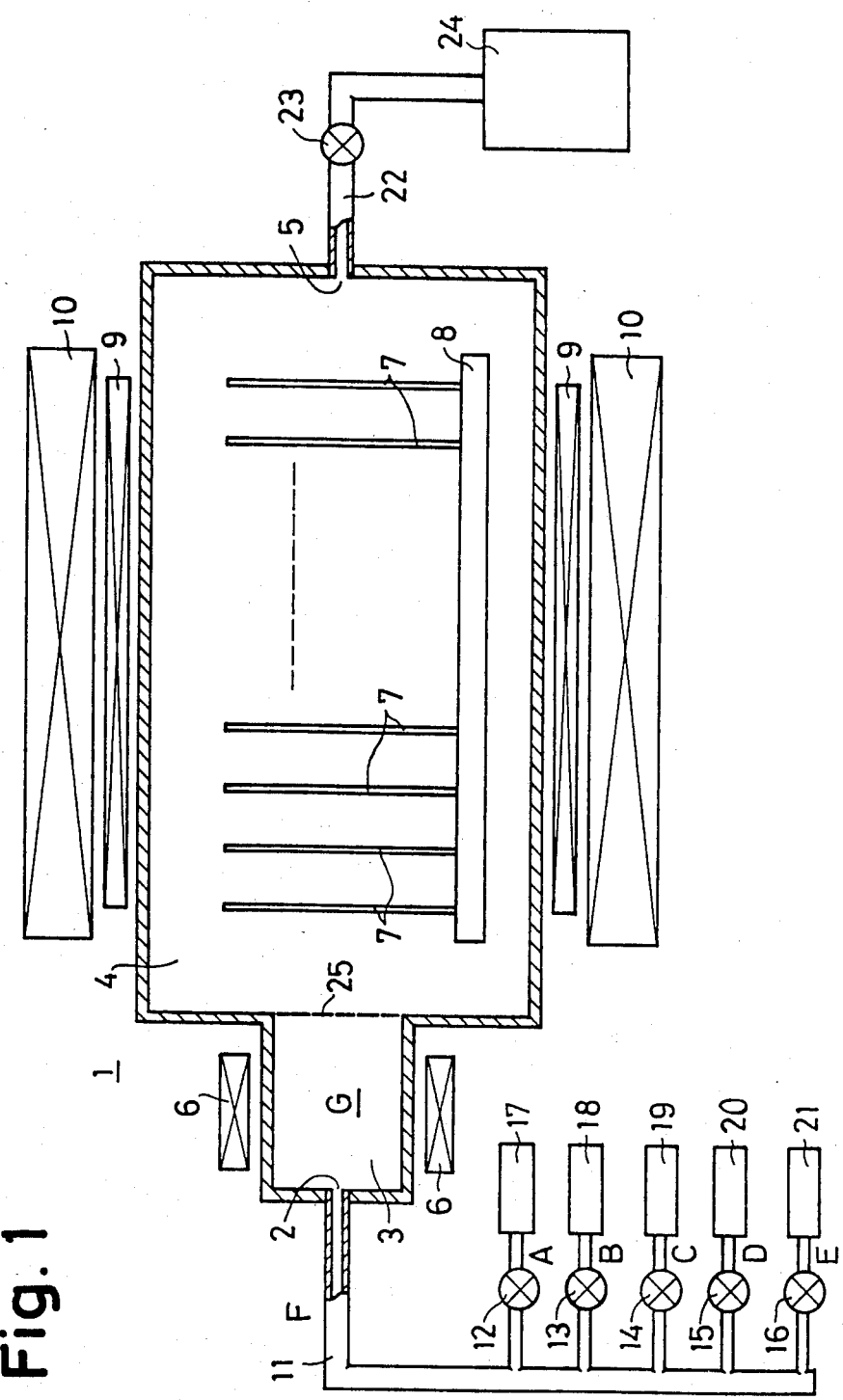
FIG. 1 is a schematic diagram illustrating an embodiment of the non-crystalline semiconductor manufacturing method of the present invention and an example of the arrangement used therefor.

FIG. 1 illustrates an embodiment of the non-crystalline semiconductor layer manufacturing method of the present invention and an arrangement therefor, in which a reaction chamber 1 is employed.

The reaction chamber 1 has a gas inlet 2, a gas ionizing region 3, a semiconductor depositing region 4, and a gas outlet 5 which are provided in this order. The gas ionizing region 3 has a smaller effective cross-section than the semiconductor depositing region 4. Arranged around the gas ionizing region 3 is an ionizing high-frequency power source 6 which applied to the gas ionizing region 3 an ionizing high-frequency electromagnetic field of, for example, as 1 to 10 GHz, preferably 2.46 GHz. The high-frequency power source 6 may be formed by a coil which is supplied with a nigh-frequency current.

Disposed around the semiconductor depositing region 4 of the reaction chamber 1 is an orientating-accelerating high-frequency power source 9 which applies to the semiconductor depositing region 4 an orientating-accelerating electric field perpendicularly to the surfaces of the substrates 7. The electric field has a relatively low alternating frequency, for example, 1 to 100 MHz, preferably 13.6 MHz. The high-frequency power source 9 may be formed by a coil which is supplied with a high-frequency current. The high-frequency power source 9 is covered with a heating source 10 which heats the semiconductor depositing region 4 and consequently the substrates 7. The heating source 10 may be a heater which is supplied with a direct current.

To the gas inlet 2 of the reaction chamber 1 is connected one end of a mixture gas supply pipe 11, to which are connected a main semiconductor material compound gas source 17, an N type impurity compound gas source 18, a P type impurity compound gas source 19, an additional semiconductor material compound gas source 20 and a carrier gas source through control valves 12, 13, 14, 15 and 16, respectively. From the main semiconductor material compound gas source 17 is supplied a main-semiconductor material compound gas A such as a main semiconductor material hydride gas, a main semiconductor material halide gas, a main semiconductor material organic compound gas or the like. The main semiconductor material gas A is, for example, a silane ($SiH_4$) gas, a dichlorosilane ($SiH_2Cl_2$) gas, a trichlorosilane ($SiHCl_3$) gas, silicon tetrachloride ($SiCl_4$) gas, a silicon tetrafluoride ($SiF_4$) gas or the like. From the N type impurity compound gas source 18 is supplied an N type impurity compound gas B such as an N type impurity hydride gas, an N type impurity halide gas, N type impurity hydroxide gas or the like, for example, a hydride, halide or hydroxide gas of nitrogen, phosphorus, arsenic, antimony, tellurium, selenium or the like. The N type impurity compound gas B is, for example, a phosphine ($PH_3$) gas, an arsine ($AsH_3$) gas or the like. From the P type impurity compound gas source 19 is supplied a P type impurity compound gas C such as a P type impurity hydride gas, a P type impurity hydroxide gas, a P type impurity halide gas or the like. The P type impurity compound gas C is, for example, a hydride, hydroxide or halide gas of boron, aluminum, gallium, indium, selenium or the like. For instance, a diborane ($B_2H_6$) gas is supplied from the P type impurity compound gas source 19. From the additional semicondcutor material compound gas source 20 is supplied an additional semiconductor material compound gas D such as an additional semiconductor material hydroxide or halide gas of nitrogen, germanium, carbon, tin lead or the like, for example, an $SnCl_2$, $SnCl_4$, $Sn(OH)_2$, $Sn(OH)_4$, $GeCl_4$, $CCl_4$, $NCl_3$, $PbC_2$, $PbCl_4$, $Pb(OH)_2$, $Pb(OH)_4$ or like gas. From the carrier gas source 21 is supplied a carrier gas E which is a gas composed of or contains a helium (He) and/or neon (Ne) gas, for example, a gas composed of the helium gas, a neon gas, or mixer gas of the helium gas or the neon gas and a hydrogen gas.

To the gas outlet 5 of the reaction chamber 1 is connected one end of a gas outlet pipe 22, which is connected at the other end to an exhauster 24 through a control valve 23. The exhauster 24 may be a vacuum pump which evacuates the gas in the reaction chamber 1 through the control valve 23 and the gas outlet tube 22.

It is preferred that a gas homogenizer 25 is provided midway between the gas ionizing region 3 and the semiconductor depositing region 4 in the reaction chamber 1.

In the semiconductor depositing region 4 of the reaction chamber 1 there are placed a plurality of parallel substrates 7 planted on a boat 8 as of quartz.

The substrates 7 may be conductive metal substrates as of stainless steel, titanium, titanium nitride or the like, semiconductor substrates as of silicon, silicon oxide, germanium or the like, insulating substrates as of alumina, glass, epoxy resin, polyimido resin or the like, substrates each having a tin oxide, indium oxide, titanium oxide or like light-transparent, conductive oxide layer formed on an insulating base plate, substrates, each having a conductive metal layer formed on an insulating base plate, or substrates, each having an N or P type smiconductor layer in a single or multi-layer form on an insulating base plate.

As described above, the substrates 7 are placed in the semiconductor depositing region 4 of the reaction chamber 1 and, in the state in which the gas in the reaction chamber 1 is exhausted by the exhauster 24 through the gas outlet 5, the gas outlet pipe 22 and the control valve 23, a mixture gas F containing at least the main semiconductor material compund gas A available from the main semiconductor material compound gas source 17 via the control valve 12 and the carrier gas F available from the carrier gas source 21 via the control valve 16 is introduced into the gas ionizing region of the reaction chamber 1 via the gas inlet 2. In this case, the mixture gas F may contain the N type impurity compound gas B available from the N type impurity compound gas source 18 via the control valve 13 or the P type impurity compound gas C available from the P type impurity compound gas source 19 via the control valve 14. Further, the mixture gas F may also contain the additional semiconductor material compound gas available from the additional semiconductor material compound gas source 20 via the control valve 15. The amount of the carrier gas E contained in the mixture gas F may be 5 to 99 flow rate %, in particular, 40 to 90 flow rate % relative to the mixture gas F.

A high-frequency electromagnetic field is applied by the ionizing, high-frequency power source 6 to the mixture gas F introduced into the gas ionizing region 3, by which the mixture gas F is ionized into a plasma, thus forming a a mixture gas plasma G in the gas ionizing region 3. In this case, the high-frequency electromagnetic field may be one that has a 10 to 300 W high-frequency energy having a frequency of 1 to 100 GHz, for example, 2.46 GHz.

Since the electromagnetic field employed for ionizing the mixture gas F into the mixture gas plasma G in the gas ionizing region 3 is a micro-wave electromagnetic field and has such a high frequency as mentioned above, the ratio of ionizing the mixture gas F into the mixture gas plasma G is high. The mixture gas plasma G contains at least a carrier gas plasma into which the carrier gas contained in the mixture gas F is ionized and a main semiconductor material compound gas plasma into which the semiconductor compound gas is ionized. Since the carrier gas contained in the mixture gas F is a gas composed of or containing the helium gas and/or the neon gas, it has a high ionizing energy. For example, the helium gas has an ionizing energy of 24.57 eV and the neon gas an ionizing energy of 21.59 eV. In contrast thereto, hydrogen and argon employed as the carrier gas in the conventional method have an ionizing energy of only 10 to 15 eV. Consequently, the carrier gas plasma contained in the mixture gas plasma has a large energy. Therefore, the carrier gas plasma promotes the ionization of the semiconductor material compound gas contained in the mixture gas F. Accordingly, the ratio of ionizing the semiconductor material compound gas contained in the mixture gas into the semiconductor material compound gas plasma is high.

Consequently, the flow rate of the semiconductor material compound gas plasma contained in the mixture gas plasma G formed in the gas ionizing region 3 is high relative to the flow rate of the entire gas in the gas ionizing region 3.

The same is true of the case where the additional semiconductor material compound gas D, the N type impurity compound gas B or P type impurity compound gas C is contained in the mixture gas F and ionized into its gas plasma.

The mixture gas plasma G thus formed is flowed into the semiconductor depositing region 4 through the gas homogenizer 25 by exhausting the gas in the reaction chamber 1 by means of the exhauster 24 through the gas outlet 5, the gas outlet pipe 22 and the control valve 23.

By flowing the mixture gas plasma G into the semiconductor depositing region 4, a semiconductor material is deposited on the substrates 7 placed in the semiconductor depositing region 4. In this case, the flow rate of the mixture gas F introduced into the reation chamber 1, especially the flow rate of the carrier gas E contained in the mixture gas F is controlled beforehand by the adjustment of the control valve 16 and the flow rate of the gas exhausted from the reaction chamber 1 through the gas outlet 5 is controlled in advance by adjustment of the control valve 23, by which the atmospheric pressure in the reaction chamber 1 is held below 1 atm. Moreover, the substrates 7 are maintained at a relatively low temperature under a temperature at which semiconductor layers dispoited on the substrates become crystallized, for example, in the range from the room temperature to 700° C. In the case of maintaining the substrates at room temperature, the heating source 10 need not be used, but in the case of holding the substrate at a temperature higher than the room temperature, the heating source 10 is used to heat the substrates 7. Furthermore, the deposition of the semiconductor material on the substrates 7 is promoted by the orientating-accelerating electric field established by the orientating-accelerating high-frequency source 9 in a direction perpendicular to the surfaces of the substrates 7.

As described above, by depositing the semiconductor material on the substrates 7 in the semiconductor depositing region 4 in the state in which the atmospheric pressure in the reaction chamber 1 is held low and the substrates 7 are held at a relatively low temperature, desired non-crystalline semiconductor layers are formed on the substrates 7.

In this case, the mixture gas plasma in the semiconductor depositing region 4 is the mixture plasma having flowed thereinto from the gas ionizing region 3, and hence is substantially homogeneous in the semiconductor depositing region 4. Consequently, the mixture gas plasma is substantially homogeneous over the entire surface of each substrate 7.

Accordingly, it is possible to obtain on each substrate 7 a non-crystalline semiconductor layer which is homogeneous in the direction of its surface and has substantially no or a negligibly small number of voids. Moreover, even if non-crystalline semiconductor layers are individually formed on a number of substrates 7 concurrently as shown, the non-crystalline semiconductor layers can be made without dispersion in their property; accordingly, non-crystalline semiconductor layers of good quality can be mass produced.

In addition, since the flow rate of the semiconductor material compound gas plasma contained in the mixture gas plasma G formed in the gas ionizing region 3 is large with respect to the flow rate of the entire gas in the gas ionizing region 3, as mentioned previously, the flow rate of the semiconductor material compound gas plasma contained in the mixture gas on the surface of each substrate 7 in the semiconductor depositing region 4 is also large relative to the flow rate of the entire gas on the surface of the substrate 7. This ensures that the non-crystalline semiconductor regions deposited on the surface of the semiconductor 7 has substantially no or a negligibly small number of voids and is homogeneous in the direction of the surface of the substrate 7.

Besides, since the carrier gas plasma contained in the mixture gas plasma formed in the gas ionizing region 3 has a large ionizing energy, as referred to previously, the energy of the carrier gas plasma has a large value when and after the mixture gas plasma flows into the semiconductor depositing region 4, and consequently the energy of the semiconductor material compound gas plasma contained in the mixture plasma on the substrate 7 in the semiconductor depositing region 4 has a large value. Accordingly, the non-crystalline semiconductor layer can be deposited on the substrate 7 with high density.

Furthermore, the carrier gas plasma contained in the mixture gas plasma is composed of or includes the helium gas plasma and/or the neon gas plasma, and hence has a high thermal conductivity. Incidentally, the helium gas plasma has a thermal conductivity of 0.123 Kcal/mHg° C. and the neon gas plasma 0.0398 Kcal/mHg° C. Accordingly, the carrier gas plasma greatly contributes to the provision of a uniform temperature distribution over the entire surface of the substrate 7. As a consequence, the non-crystalline semiconductor layer deposited on the substrate 7 can be made homogeneous in the direction of its surface.

Moreover, since the carrier gas plasma contained in the mixture gas in the semiconductor depositing region 4 is a gas plasma composed of or containing the helium gas plasma and/or the neon gas plasma, the helium gas plasma is free to move in the non-crystalline semiconductor layer formed on the substrate 7. This reduces the density of recombination centers which tends to be formed in the non-crystalline semiconductor layer, ensuring to enhance its property.

In accordance with the above embodiment of the present invention, it is possible to form on the substrate 7 a non-crystalline semiconductor layer which has substantially no voids or, if any, a negligibly small number of voids and is homogeneous in the direction of its surface. That is, for example, a non-crystalline silicon layer can be formed on the substrate; further, an N type, non-crystalline silicon layer can also be formed which contains an N type, impurity as of nitrogen, phosphorus, arsenic, antimony, tellurium or selenium may also be formed; moreover, a P type, non-crystalline silicon layer can also be formed which contains a P type impurity as of boron, aluminum, gallium, indium or selenium, furthermore, a non-crystalline compound semiconductor layer can also be formed which is composed of, for example, silicon and nitrogen, germanium, carbon, tin or lead; in addition, a non-crystalline compound semiconductor layer can also be formed which is expressed by, for example, $Si_3N_{4-x}$ $(0<x<1)$, $Si_xGe_{1-x}$ $(0<x<1)$, $Si_xC_{1-x}$ $(0<x<1)$, $Si_xSn_{1-x}$ $(0<x<1)$ or $Si_xPb_{1-x}$ $(0<x<1)$; besides, an N or P type, non-crystalline compound semiconductor layer can also be formed in which the abovesaid non-crystalline compound semiconductor layer contains the abovesaid N or P type impurity. It is also possible to form a non-crystalline compound semiconductor layer whose composition ratio continuously varies in its thickwise direction. Furthermore, it is also possible to form a non-crystalline semiconductor layer whose composition ratio continuously varies from the composition ratio of a silicon layer to that of a non-crystalline compound semiconductor layers. Also it is possible to form a non-crystalline semiconductor layer which has formed therein one or more PN or hetero junctions.

According to the method of the present invention described above, the non-crystalline semiconductor layer is formed in the presence of the helium gas plasma and/or the neon gas plasma, and hence is annealed. If necessary, however, the non-crystalline semiconductor layer thus annealed may also be further annealed, using the helium gas plasma and/or neon gas plasma alone.

Figure 2:
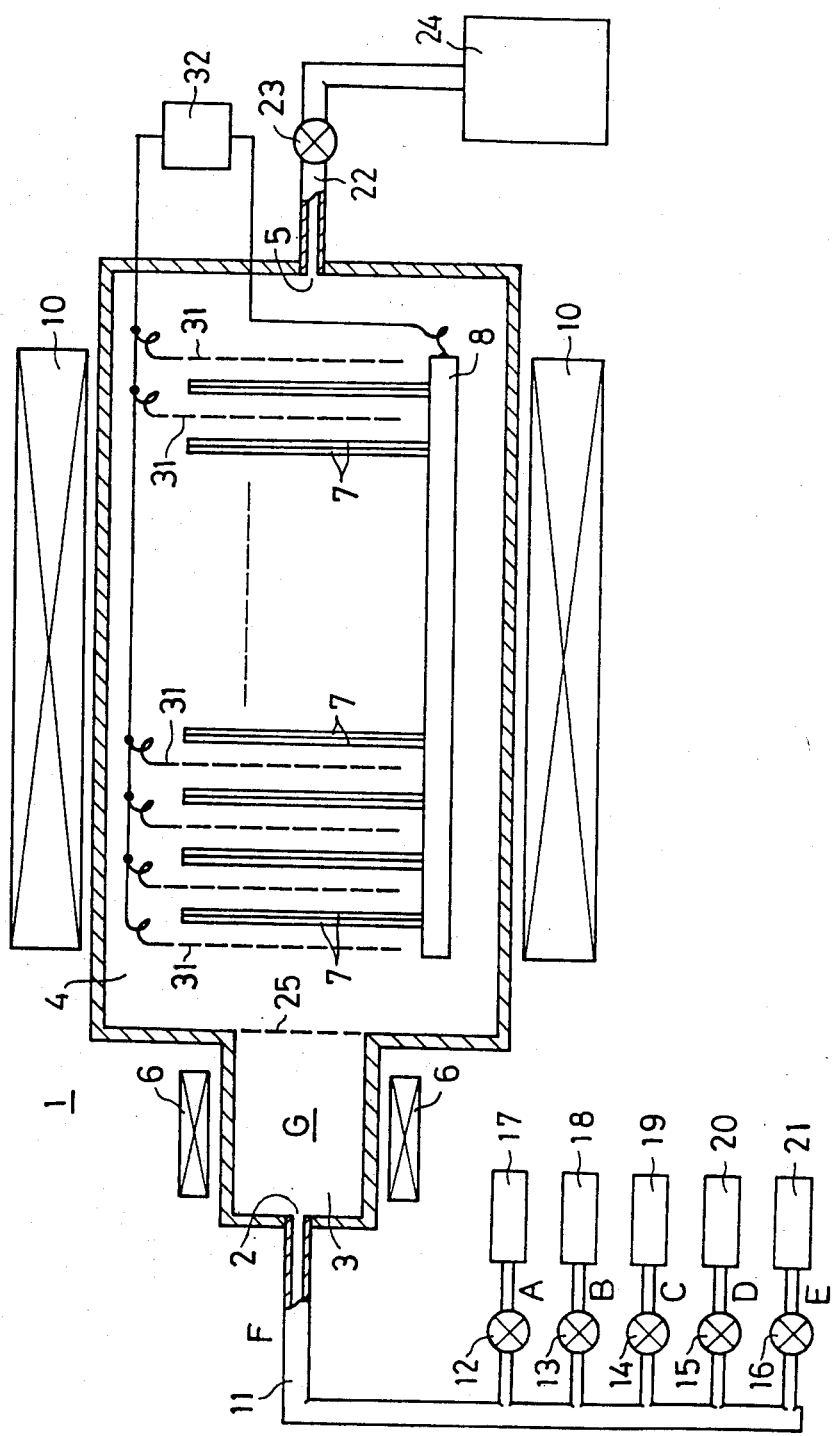
FIG. 2 is a schematic diagram showing another embodiment of the present invention and an example of the arrangement therefor.

Next, another embodiment of the non-crystalline semiconductor layer manufacturing method of the present invention will be described with reference to FIG. 2 which illustrates an example of the apparatus for use in this embodiment. In FIG. 2, parts corresponding to those in FIG. 1 are identified by the same reference numerals. The illustrated apparatus, though not described in detail, is identical in construction with the apparatus of FIG. 1 except in that the orientating-accelerating high-frequency source 9 disposed around the semiconductor depositing region 4 is omitted, in that a plurality of pairs of substrates 7 assembled together facing in opposite directions are disposed in parallel in the semiconductor depositing region 4 of the reaction chamber 1, in that a mesh-, grid- or blind-like electrode 31 is disposed between adjacent pairs of substrates 7 in parallel therewith, and in that an orientating-accelerating DC power source 32 is connected between the electrodes 31 and the pairs of substrates 7 via the boat 8 to set up an orientating-accelerating DC electric field perpendicular to the surface of each substrate 7. In this case, the boat 8 and each pair of substrates 7 are conductive or provided with a conductive layer so that they may be electrically connected with the orientating-accelerating DC power source 32.

In exactly the same manner as described previously in conjunction with FIG. 1, the mixture gas F containing at least the semiconductor material compound gas A and the carrier gas E is introduced via the gas inlet 2 into the gas ionizing region 3 of the reaction chamber 1 while exhausting the gas in the reaction chamber 1.

The high-frequency electromagnetic field set up by the high frequency power source 6 is applied to the mixture gas F to ionize it into a plasma, as described previously in connection with FIG. 1. As a result of this, the mixture gas plasma G is formed in the gas ionizing region 3.

Then, the mixture gas plasma G thus formed is flowed into the semiconductor depositing region 4 as in the case of the embodiment of FIG. 1, by which the semiconductor material is deposited on the surface of each substrate 7. In this case, as in the same manner as set forth previously in respect of FIG. 1, the atmospheric pressure in the reaction chamber 1 is held low and the substrates 7 are maintained at a relatively low temperature, whereby non-crystalline semiconductor layers are formed on the substrates 7. In this case, however, by the orientating-accelerating DC electric field set up by the orientating-accelerating DC power source 32 in a direction perpendicular to the surface of each substrate 7, the mixture gas plasma in the semiconductor depositing region 4 is oriented towards the substrate 7 to orientate and accelerate thereto semiconductor ions, thus promoting the deposition of the semiconductor material on the substrate 7.

The embodiment illustrated by FIG. 2 is similar to the embodiment illustrated by FIG. 1 except in that the mixture gas plasma in the semiconductor depositing region 4 of the reaction chamber 1 is orientated and accelerated by the DC electromagnetic field to orientate and accelerate the semiconductor material ions towards the substrate 7, thereby promoting the deposition thereon of the semiconductor.

Accordingly, the embodiment illustrated by FIG. 2 has the same excellent features as those obtainable with the embodiment illustrated by FIG. 1 and the advantage that the non-crystalline semiconductor layer on the substrate 7 can be formed with higher density by the orientation and acceleration of the mixture gas plasma towards the substrate 7 by the DC electric field. In this case, however, the DC electric field must be selected to a suitable intensity, for example, 100 to 1000 V in terms of the voltage available from the DC power source 32.

Figure 3:
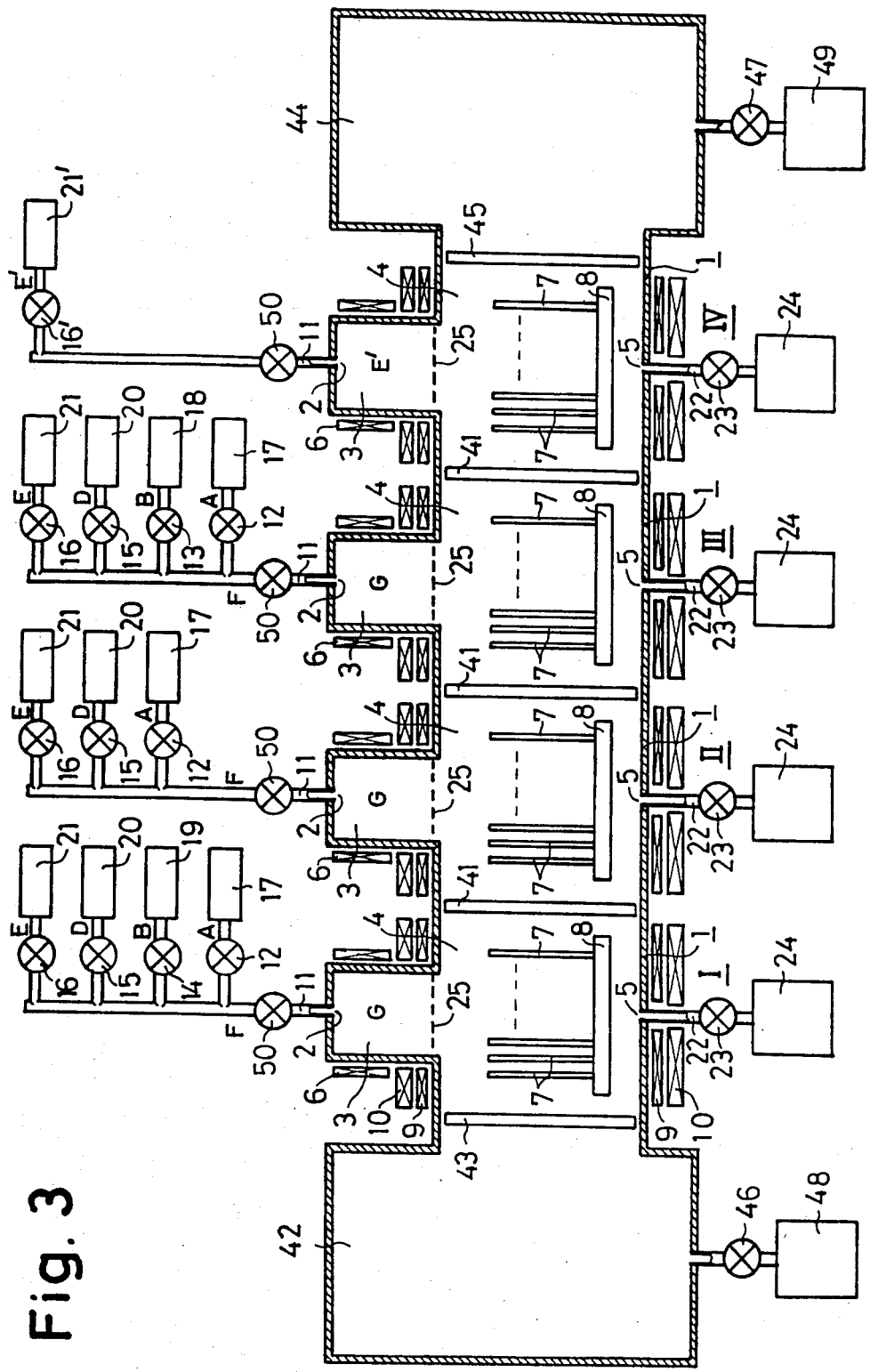
FIG. 3 is a schematic diagram showing still another embodiment of the present invention and an example of the arrangement therefor.

Next, a description will be given, with reference to FIG. 3, of still another embodiment, in which a P type non-crystalline semiconductor layer, an I type (intrinsic) non-crystalline semiconductor layer and an N type non-crystalline semiconductor layer are sequentially formed on each substrate in this order. In FIG. 3, parts corresponding to those in FIG. 1 are marked with the same reference numerals and no detailed description will be repeated. In the apparatus of FIG. 3, four reaction chambers 1, each identical in construction with the reaction chamber 1 described previously in conjunction with FIG. 1, are formed as a unitary structure with one another in such a manner that the semiconductor depositing regions 4 of adjacent ones of the reaction chamber 1 intercommunicate, with a shutter 41 interposed therebetween and the reaction chambers respectively form reaction parts I, II, III and IV.

In this case, the gas sources for the reaction part I do not include the N type impurity compound gas source 18 in the embodiment of FIG. 1; the gas sources for the reaction part II do not include the N type impurity compound gas source 18 and the P type impurity compound gas source 19 in the embodiment of FIG. 1; and the gas sources for the reaction part III do not include the P type impurity compound gas source in the embodiment of FIG. 1. The gas source for the reaction part IV is only the carrier gas source 21 from which is available a carrier gas E' consisting of one or more of helium, neon and hydrogen gases. Each mixture gas supply pipe 11 has a control valve 50 on the side of the reaction part. The reaction part I communicates, on the opposite side from the reaction part II, with a chamber 42, with a shutter 43 interposed therebetween. The chamber 42 is provided for inserting into the semiconductor depositing region 4 of the reaction part I the boat 8 having planted thereon the substrates 7 to be deposited with non-crystalline semiconductor layers. The reaction part IV communicates, on the opposite side from the reaction part III, with a chamber 44, with a shutter 45 interposed therebetween. The chamber 44 is provided for taking out from the semiconductor depositing region 4 the boat 8 having planted thereon the substrates 7 deposited with the non-crystalline semiconductor layers. The chambers 42 and 44 have connected thereto respectively via control valves 46 and 47 exhausters 48 and 49 similar to the aforesaid one 24.

The boat 8 having planted thereon the substrates 7, which is placed beforehand in the chamber 42 evacuated by the exhauster 47, is inserted into the semiconductor depositiing region 4 of the reaction part I, opening the shutter 43. The insertion of the boat 8 is carried out in such a state in which the reaction part I is entirely evacuated or only the carrier gas E flows into the reaction part I. Then, in the semiconductor depositing region 4 a P type, non-crystalline semiconductor layer is deposited on each substrate 7 in the same manner as described previously with regard to FIG. 1.

Thereafter, the boat 8 carrying the substrates 7 respectively deposited with the P type, non-crystalline semiconductor layers is inserted into the semiconductor depositing region 4 of the reaction part II, with the shutter 41 opened. This insertion of the boat 8 is carried out in such a state in which the reaction parts I and II are entirely evacuated or only the carrier gas E flows therein. In the semiconductor depositing region 4 an I type non-crystalline semiconductor layer is formed on the P type, non-crystalline semiconductor layer of each substrate 7 in the same manner as described previously in respect of FIG. 1.

Following this, the boat 8 carrying the substrates 7, each having formed thereon the P type, non-crystalline semiconductor layer and the I-type, non-crystalline semiconductor layer in this order, is inserted from the reaction part II into the semiconductor depositing region 4 of the reaction part III, with the shutter 41 opened. Also in this case, the boat 8 is inserted into the reaction part III in such a state in which the reaction parts II and III are entirely evacuated or only the carrier gas E flows therein. In the semiconductor depositing region 4 of the reaction part III an N type, non-crystalline semiconductor layer is deposited on the I type, non-crystalline semiconductor layer of each substrate 7 in the same manner as described previously with reference to FIG. 1.

Then, the boat 8 which carries the substrates 7, each having formed thereon the P type, I type and N type, non-crystalline semiconductor layers in this order, is inserted from the reaction part III into the semiconductor depositing region 4 of the reaction part IV, with the shutter 41 opened. In this case, the boat 8 is inserted into the reaction part IV in such a state in which the reaction parts III and IV are entirely evacuated or only the carrier gases E' are passed thereinto. In the semiconductor depositing region 4 of the reaction part IV the P, I and N type, non-crystalline semiconductor layers formed on each substrate 7 are annealed by a carrier gas plasma into which the carrier gas E' is ionized in the gas ionizing region 3.

Thereafter, the boat 8 carrying the substrates, each deposited with the P, I and N type, non-crystalline layers, is inserted into the chamber 44 from the reaction part IV, with the shutter 45 opened. In this case, the reaction part IV is entirely evacuated or only the carrier gas E is passed thereinto.

Then, the substrates having thus deposited thereon the P, I and N type, non-crystalline semiconductor layers are taken out from the chamber 44.

It will be apparent that many modifications and variations may be effected without departing from the scope of the novel concepts of this invention.

What is claimed is:

1. Apparatus for manufacturing a multi-layer, non-single-crystalline semiconductor comprising:

a first reaction chamber for positioning a substrate to fabricate thereon a first non-single-crystalline semiconductor layer having a P conductivity type;

a second reaction chamber disposed adjacent said first reaction chamber and separated therefrom by a first shutter means, for positioning the substrate with the first non-single-crystalline semiconductor layer to fabricate a second non-single-crystalline semiconductor layer having an I conductivity type on the first non-single-crystalline semiconductive layer;

a third reaction chamber disposed adjacent said second reaction chamber and separated therefrom by a second shutter means, for positioning the substrate with the first and second non-single-crystalline semiconductor layers to fabricate a third non-single-crystalline semiconductor layer having an N conductivity type on the second non-single-crystalline semiconductor layer;

a further reaction chamber disposed adjacent said second reaction chamber and separated therefrom by a further shutter means, for positioning the multi-layer semiconductor fabricated in the third reaction chamber, said further reaction chamber including a gas ionizing region and an annealing region;

a first gas source connected to said first reaction chamber through a first gas supply control means, for introducing into said first reaction chamber a first gas containing at least a first semiconductor material gas and a first impurity gas imparting said P conductivity type to the first non-single-crystalline semiconductor layer;

a second gas source connected to said second reaction chamber through a second gas supply control means, for introducing into said second reaction chamber a second gas containing at least a second semiconductor material gas but with no impurity gas;

a third gas source connected to said third reaction chamber through a third gas supply control means, for introducing into said third reaction chamber a third gas containing at least a third semiconductor material gas and a second impurity gas imparting said N conductivity type to the third non-single-crystalline semiconductor layer;

a further gas source connected to said further reaction chamber for introducing a carrier gas into the gas ionizing region of the further reaction chamber;

a first gas ionizing means associated with said first reaction chamber, for ionizing said first gas introduced into said first reaction chamber to produce a first gas plasma;

a second gas ionizing means associated with said second reaction chamber, for ionizing said second gas introduced into said second reaction chamber to produce a second gas plasma;

a third gas ionizing means associated with said third reaction chamber, for ionizing said third gas introduced into third reaction chamber to produce a third gas plasma;

a further gas ionizing means associated with the further reaction chamber for ionizing the carrier gas introduced into the gas ionizing region of the further reaction chamber;

a first gas exhaust means connected to said first reaction chamber through a first gas exhaust control means, for flowing the first gas plasma through the first reaction chamber to effect a deposition of the first semiconductor material to fabricate the first non-single-crystalline semiconductor layer onto the substrate and maintaining the pressure in the first reaction chamber below one atmosphere;

a second gas exhaust means connected to said second reaction chamber through a second gas exhaust control means for flowing the second gas plasma through the second reaction chamber to effect a deposition of the second semiconductor material to fabricate the second non-single-crystalline semiconductor layer onto the first non-single-crystalline semiconductor layer and maintaining the pressure in the second reaction chamber below one atmosphere;

a third gas exhaust means connected to said third reaction chamber through a third gas exhaust control means, for flowing the third gas plasma through the third reaction chamber to effect a deposition of the third semiconductor material to fabricate the third non-single-crystalline semiconductor material onto the second non-single-crystalline semiconductor layer and maintaining the pressure in the third reaction chamber below one atmosphere;

a further gas exhaust means connected to the further reaction chamber for (a) flowing the ionized carrier gas from the gas ionizing region to the annealing region to anneal the substrate support thereat and (b) maintaining the pressure in the further reaction chamber below one atmosphere;

means for maintaining the temperature of the substrate in each reaction chamber at a temperature lower than that at which single-crystallization of the deposited semiconductor materials occurs;

an insert chamber disposed adjacent said first reaction chamber and separated therefrom by a second further shutter means for inserting the substrate into the first reaction chamber;

a take-out chamber disposed adjacent said further reaction chamber and separated therefrom by another shutter means, for taking out the substrate with the multi-layer, non-single-crystalline semiconductor from said further reaction chamber;

means for displacing the shutter means between the first reaction chamber and the second reaction chamber to permit movement of the substrate from the first reaction chamber to the semiconductor depositing region of the second reaction chamber while the first and second reaction chambers are entirely evacuated or only carrier gases are passed therethrough so that said second semiconductor layer may then be deposited on said first semiconductor layer;

means for displacing the shutter means between the second and third reaction chambers to permit movement of the substrate having deposited thereon the first and second semiconductor layers from the second reaction chamber to the third reaction chamber while the second and third reaction chambers are entirely evacuated or while only carrier gases are passed therethrough so that said third semiconductor layer may be deposited on said second semiconductor layer to fabricate the said multi-layer, non-single-crystalline semiconductor; and means for displacing the shutter means between the third and further reaction chambers to permit movement of the multi-layer, non-crystalline semiconductor from the third reaction chamber to the annealing region of the further reaction chamber while the third and further reaction chambers are entirely evacuated or only carrier gases are passed therethrough so that the multi-layered, non-single-crystalline semiconductor may then be annealed.

2. Apparatus as in claim 1 wherein the semiconductor material gas contained in the gas introduced into the second reaction chamber consists principally of a silicon compound gas thereby to form the second non-single-crystalline semiconductor layer as a non-single-crystalline semiconductor consisting principally of non-single-crystalline silicon.

3. Apparatus as in claim 1 wherein the semiconductor material gas contained in the mixture gas introduced into the first and third reaction chambers consists principally of a silicon compound gas and contains an additional semiconductor material compound gas as of nitrogen, germanium carbon, tin or lead, thereby to form the first and third non-single-crystalline semiconductor layers consisting of silicon and the additional semiconductor material compound, expressed by $Si_3N_{4-x}$ $(0<x<4)$, $Si_xGe_{1-x}(0<x<1)$, $Si_xC_{1-x}(0<x<1)$, $Si_xC_{1-x}(0<x<1)$, $Si_xSn_{1-x}(0<x<1)$ or $Si_xPb_{1-x}$ $(0<x<1)$.

4. Apparatus as in claim 3 wherein the first and third non-single-crystalline semiconductor layers each is stoichiometrically identical in composition in the direction of its surface but different in the direction of its thickness.

* * * * *